(12) United States Patent
Morimoto

(10) Patent No.: US 8,797,501 B2
(45) Date of Patent: Aug. 5, 2014

(54) EXPOSURE APPARATUS AND DEVICE MANUFACTURING METHOD

(75) Inventor: Osamu Morimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 578 days.

(21) Appl. No.: 12/631,619

(22) Filed: Dec. 4, 2009

(65) Prior Publication Data

US 2010/0141913 A1   Jun. 10, 2010

(30) Foreign Application Priority Data

Dec. 8, 2008  (JP) .................................. 2008-312490
Nov. 13, 2009 (JP) .................................. 2009-259793

(51) Int. Cl.
*G03B 27/52* (2006.01)
*G03F 7/20* (2006.01)

(52) U.S. Cl.
CPC ........ *G03F 7/70875* (2013.01); *G03F 7/70283* (2013.01); *G03F 7/70783* (2013.01); *G03F 7/70508* (2013.01)
USPC ..................... 355/30; 355/52; 355/53; 355/55

(58) Field of Classification Search
CPC ............ G03F 7/70875; G03F 7/70283; G03F 7/70783; G03F 7/70508
USPC ................... 355/30, 52, 53, 55; 356/399–401
See application file for complete search history.

(56) References Cited

U.S. PATENT DOCUMENTS 4,757,355 A * 7/1988 Iizuka et al. .................... 355/75
5,581,324 A * 12/1996 Miyai et al. ..................... 355/53
6,088,082 A * 7/2000 Yonekawa ........................ 355/53
6,342,941 B1 * 1/2002 Nei et al. ......................... 355/52
6,809,793 B1 * 10/2004 Phan et al. ....................... 355/30
7,110,116 B2    9/2006 Oishi et al.
7,173,716 B2    2/2007 Oishi et al.
2003/0118925 A1 * 6/2003 Shima ............................. 430/22
2006/0256305 A1 * 11/2006 Won ................................ 355/30
2008/0062392 A1 * 3/2008 Amano ............................ 355/52

FOREIGN PATENT DOCUMENTS

| JP | 10-199782 A | 7/1998 |
| JP | 11-195602 A | 7/1999 |
| JP | 2003-142363 A | 5/2003 |
| JP | 2008-172102 A | 7/2008 |

* cited by examiner

*Primary Examiner* — Steven H Whitesell Gordon
(74) *Attorney, Agent, or Firm* — Canon USA, Inc., IP Division

(57) ABSTRACT

An apparatus which projects a pattern of an original onto a substrate by a projection optical system within a chamber to expose the substrate, comprises a measurement unit which performs measurement to calculate a deformation amount of the original, and a controller which calculates a predicted deformation amount of the original and corrects a projection magnification of the projection optical system so as to correct the predicted deformation amount, based on information representing a relationship between the deformation amount with reference to a shape of the original at a certain temperature and a time for which the original receives exposure light, a deformation amount of the original before exposure determined based on a measurement value obtained by measuring, by the measurement unit, the deformation amount of the original loaded into the chamber and unused for exposure, and the time for which the original receives the exposure light.

10 Claims, 6 Drawing Sheets

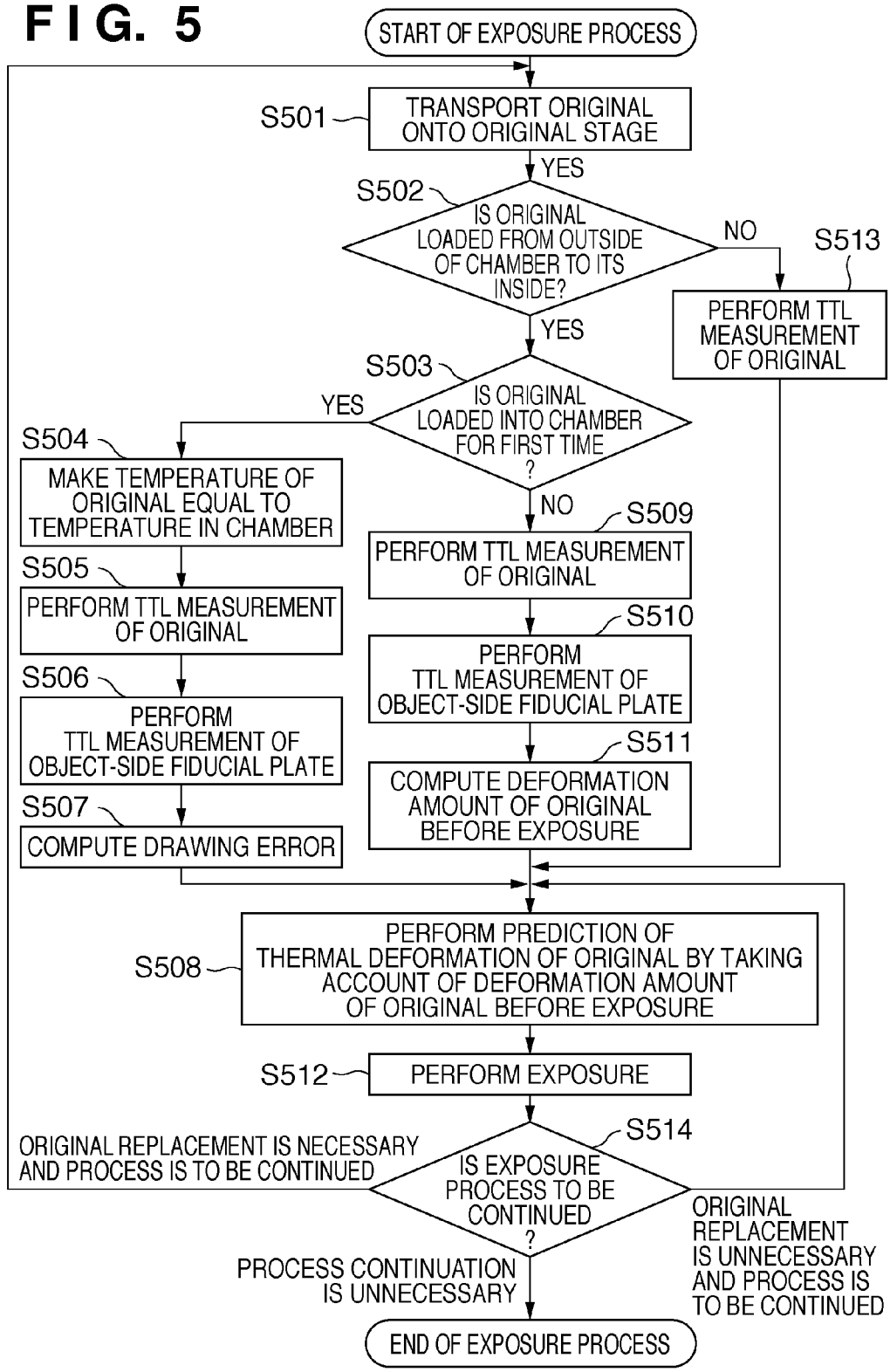

EXPOSURE APPARATUS AND DEVICE MANUFACTURING METHOD

BACKGROUND OF THE INVENTION

1. Field of the Invention

The present invention relates to an exposure apparatus which projects the pattern of an original onto a substrate by a projection optical system within a chamber to expose the substrate, and a method of manufacturing a device using the exposure apparatus.

2. Description of the Related Art

In recent years, an exposure apparatus for manufacturing devices such as a semiconductor device has been required to further improve resolution, overlay accuracy, and throughput. In the current mass production line of semiconductor devices, a high-resolution exposure apparatus is commonly used to pattern a critical layer, whereas a high-throughput exposure apparatus which has a relatively low resolution but a wide angle of view is commonly used to pattern a non-critical layer.

In this manner, an improvement in overlay accuracy is of prime importance in processes which use a plurality of exposure apparatuses having different specifications. To improve the overlay accuracy, it is necessary not only to suppress a shift, the magnification, and rotational components of a shot array within the plane of a substrate, but also to suppress fluctuations in, e.g., magnification and distortion within shots. Fluctuations in, e.g., magnification and distortion are thought to be accounted for by thermal deformation of an original (reticle) and an optical element which constitutes a projection optical system when the original and optical element absorb exposure light.

FIG. 1A is a graph illustrating the result of evaluation of deformation of an original as a magnification fluctuation attributed to the deformation. FIG. 1B is a graph illustrating the result of evaluation of deformation of an optical element in a projection optical system. In FIGS. 1A and 1B, the abscissa indicates the time for which the original and optical element receive exposure light. Upon receiving the exposure light, the original and optical element absorbs the exposure light and so heat up and deform. This deformation causes a magnification fluctuation. A magnification fluctuation $\beta r$ attributed to deformation of the original reaches a saturation magnification $\beta rs$ after the elapse of a time $\tau r$. A magnification fluctuation $\beta 1$ attributed to deformation of the optical element in the projection optical system reaches a saturation magnification $\beta 1s$ after the elapse of a time $\tau 1$.

In the magnification fluctuations shown in FIGS. 1A and 1B, the time constants $\tau r$ and $\tau 1$ each are a function of a thermometric conductivity $\alpha (=k/\rho c$ where k is the thermal conductivity, $\rho$ is the density, and c is the specific heat) of a material, and therefore stay constant even when energies absorbed by the original and projection optical element increase in response to a change in exposure condition. In view of this, as long as these time constants are calculated in advance, the deformation amounts of the original and optical element can be predicted from the time constants and the thermal loads (the exposure energies, the irradiation times, and the non-irradiation times) on the original and optical element, which dynamically change upon exposing the substrate by an exposure apparatus.

Japanese Patent Laid-Open No. 10-199782 discloses a method of correcting the magnification of a projection system based on a change curve describing thermal deformation of an original (reticle) for the exposure time and that describing thermal deformation of the projection system for the exposure time. In this method, the time constants of the original and projection system are calculated in advance. During a substrate exposure process, the deformation amounts of the original and projection system can be predicted based on the change curves and the times for which the original and projection system are irradiated with exposure light. Change curves describing thermal deformation of the original and projection system can be obtained based on the exposure results (the amounts of change in exposure shot magnification) obtained by, for example, exposing the original and projection system by imposing thermal loads on them in a cool state.

The deformation amount of an original when it is subjected to a thermal load can be predicted in accordance with change curves as mentioned above. However, an actual original often does not have a shape conforming to its design even while a thermal load imposed on the original upon exposure is zero (even before exposure). This is accounted for by the temperature difference between the interior and exterior of a chamber in the exposure apparatus. An original has a temperature that has not been equal to the temperature in the chamber for an appropriate time after the original is loaded from the outside of the chamber to its inside. Hence, an original which has just been loaded from the outside of the chamber to its inside is deformed with reference to the shape of the original at the temperature in the chamber.

The temperature difference between the interior and exterior of the chamber may be, for example, about 2° C. to 3° C. The magnification fluctuations illustrated in FIGS. 1A and 1B bear no information of the deformation amount of the original attributed to the temperature difference between the interior and exterior of the chamber (the deformation amount with reference to the shape of the original at the temperature in the chamber).

For example, as illustrated in FIG. 2, assume that the magnification error attributed to deformation of the original is $\beta 0$ before exposure due to the temperature difference between the interior and exterior of the chamber in the exposure apparatus. A conventional method does not take account of magnification error that has been generated before exposure due to the temperature difference between the interior and exterior of the chamber. Accordingly, as indicated by a solid line 200, the result of addition of a magnification fluctuation corresponding to the change curve illustrated in FIG. 1A to $\beta 0$ is determined as an actual magnification fluctuation by mistake, and the magnification of the projection optical system is controlled so as to correct the calculated magnification fluctuation. In reality, a magnification fluctuation asymptotically converges to $\beta rs$.

SUMMARY OF THE INVENTION

The present invention has been made in consideration of the above-mentioned analysis and provides a technique for more precisely correcting the projection magnification of a projection optical system even when there is a temperature difference between the interior and exterior of a chamber in an exposure apparatus.

One of the aspect of the present invention provides an exposure apparatus which projects a pattern of an original onto a substrate by a projection optical system within a chamber to expose the substrate, comprises a measurement unit configured to perform measurement to calculate a deformation amount of the original, and a controller configured to calculate a predicted deformation amount of the original and to correct a projection magnification of the projection optical system so as to correct the predicted deformation amount, based on information representing a relationship between the deformation amount of the original with reference to a shape of the original at a certain temperature and a time for which the original receives exposure light, the deformation amount of the original before exposure determined based on a measurement value obtained by measuring, by the measurement unit, a deformation amount of the original which is loaded into the chamber and unused for exposure, and the time for which the original receives the exposure light.

Further features of the present invention will become apparent from the following description of exemplary embodiments with reference to the attached drawings.

BRIEF DESCRIPTION OF THE DRAWINGS

FIG. 5 is a flowchart showing the operation of an exposure apparatus EX according to the embodiment of the present invention.

DESCRIPTION OF THE EMBODIMENTS

Embodiments of the present invention will be described below with reference to the accompanying drawings.

Figure 3:
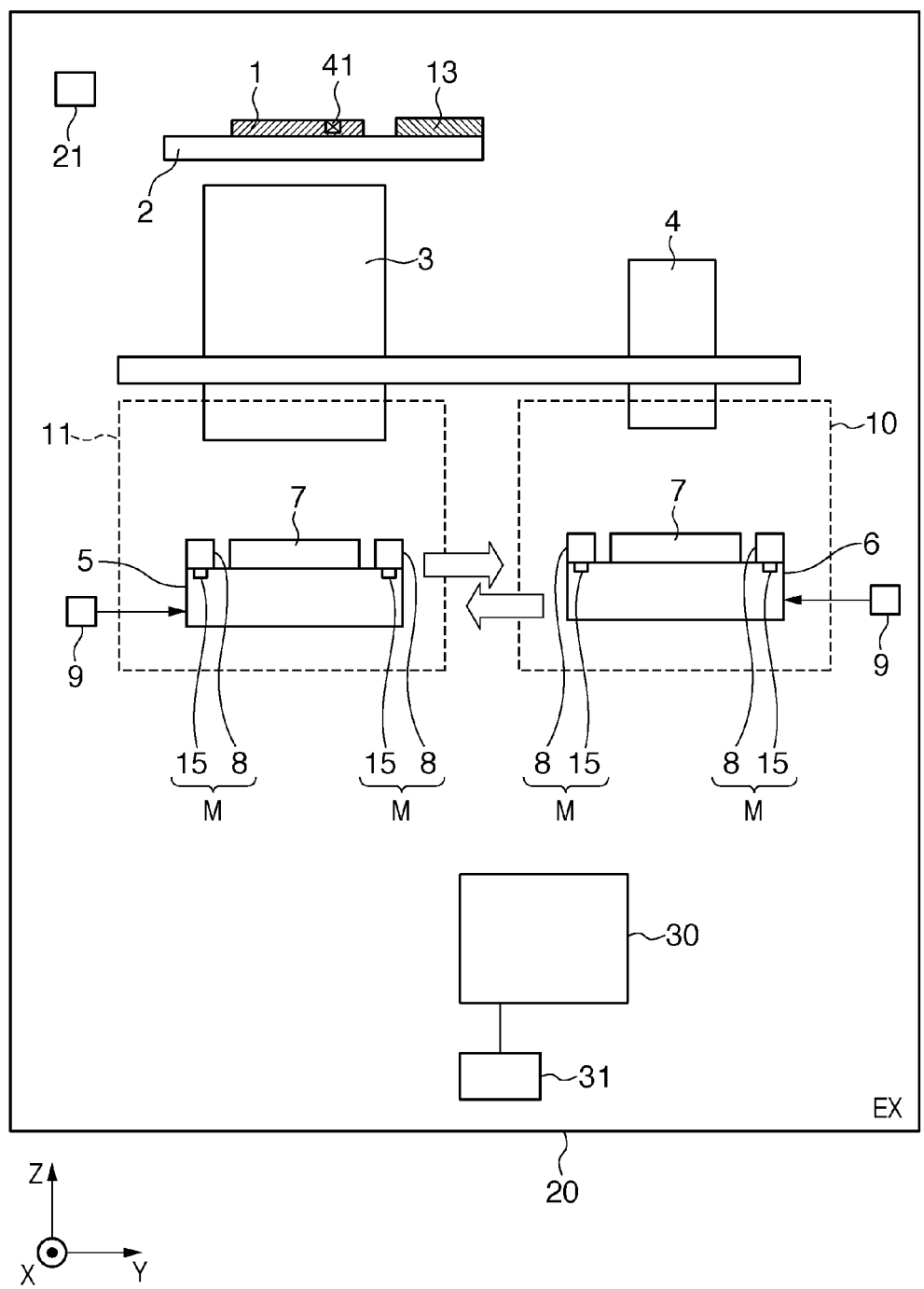
FIG. 3 is a diagram showing the schematic arrangement of an exposure apparatus according to an embodiment of the present invention.

FIG. 3 is a diagram showing the schematic arrangement of an exposure apparatus according to an embodiment of the present invention. An exposure apparatus EX includes a chamber 20 and is configured to project the pattern of an original (also called a reticle or a mask) 1 onto a substrate (e.g., a wafer or a glass plate) 7 by a projection optical system 3 to expose the substrate 7. A controller 30 controls the operation of the exposure apparatus EX. Although the exposure apparatus EX can include, for example, two substrate stages 5 and 6, the number of substrate stages may be one or three or more.

An original 1 is loaded from the outside of the chamber 20 to its inside and held by an original stage 2. Substrates 7 are loaded from the outside of the chamber 20 to its inside and held by the substrate stages 5 and 6. Laser interferometers 9 measure the positions of the substrate stages 5 and 6.

The substrate 7 held by one of the substrate stages 5 and 6 is measured in a measurement area 10 first, and exposed in an exposure area 11 next while using the obtained measurement value. While the substrate 7 held by one of the substrate stages 5 and 6 is measured in the measurement area 10, the substrate 7 held by the other one of the substrate stages 5 and 6 is exposed in the exposure area 11. The measurement in the measurement area 10 includes measurement of alignment errors of a substrate and shot regions formed on it, and measurement of the substrate surface position.

Figure 4A:
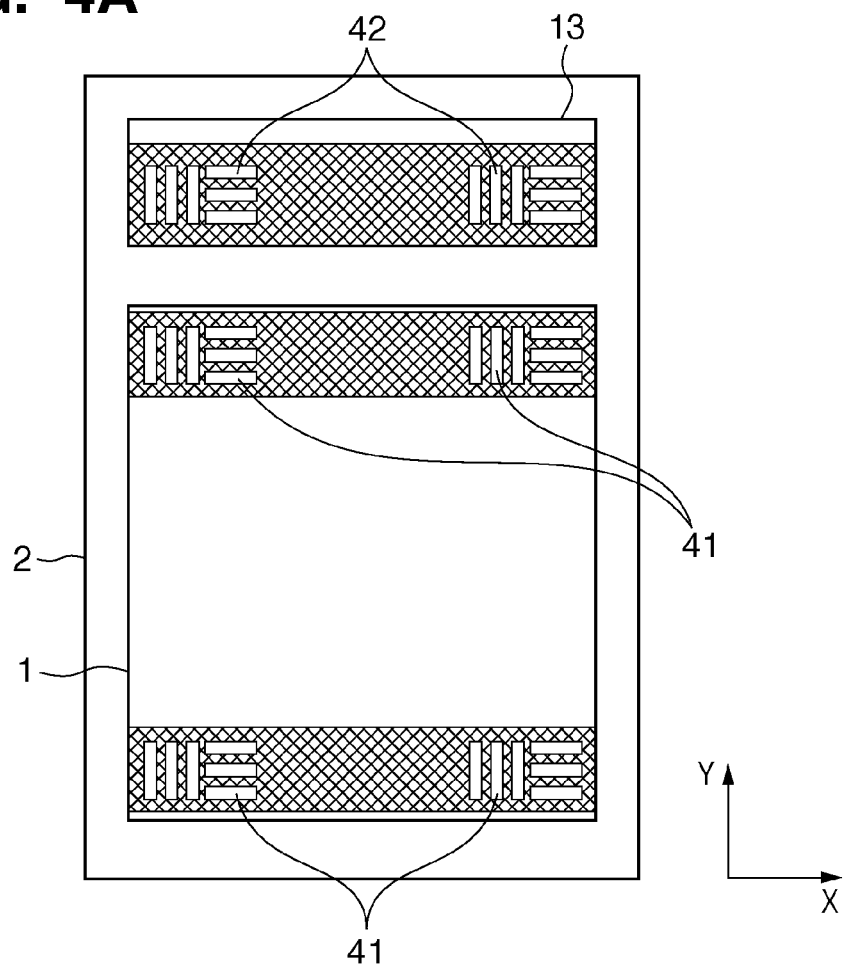
FIG. 4A is a plan view schematically showing the arrangement of an original and original stage.
Figure 4B:
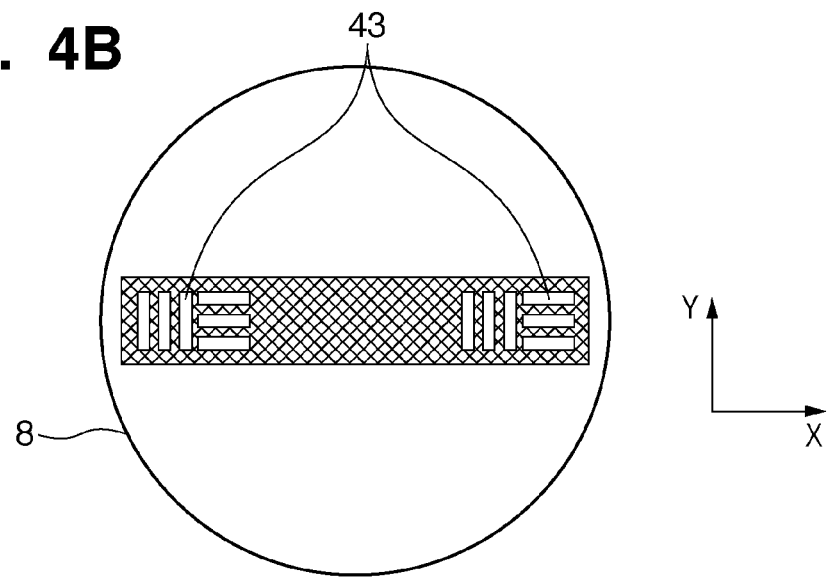
FIG. 4B is a plan view schematically showing the arrangement of an image-side fiducial plate.

To measure the positions of the substrate stages 5 and 6, image-side fiducial plates 8 each including image-side fiducial marks 43 are located on the substrate stages 5 and 6. FIG. 4B is a plan view schematically showing the arrangement of the image-side fiducial plate 8. The image-side fiducial plate 8 can be configured by, for example, forming a light-shielding film including the image-side fiducial marks 43 on a glass substrate. The light-shielding film can be made of, for example, chromium. A photosensor 15 which detects light having passed through the image-side fiducial marks 43 is disposed under the corresponding image-side fiducial plate 8. The image-side fiducial plate 8 and photosensor 15 constitute a measurement unit M.

In the measurement area 10, the corresponding image-side fiducial marks 43 are detected using an alignment scope 4 to measure the positions of the substrate stages 5 and 6. The alignment scope 4 can include, for example, a microscope and an image sensor such as a CCD.

In the exposure area 11, the following measurement can be performed. FIG. 4A is a plan view schematically showing the arrangement of the original 1 and original stage 2. The original 1 includes alignment marks 41 drawn on it. The marks 41 can be configured by, for example, forming opening portions in a light-shielding film made of, e.g., chromium. An illumination system (not shown) illuminates the marks 41 with light. The light having passed through the marks 41 strikes the image-side fiducial marks 43 formed on the image-side fiducial plates 8 via the projection optical system 3. The light having passed through the image-side fiducial marks 43 is detected by the photosensors 15 disposed under the image-side fiducial plates 8. When the positions, in the in-plane direction (in a direction parallel to a plane perpendicular to the optical axis of the projection optical system 3), of the marks 41 drawn on the original 1 and the image-side fiducial marks 43 formed on the image-side fiducial plates 8 are aligned with each other, the photosensors 15 detect a maximum light amount. Also, when the image-side fiducial marks 43 are aligned with the image plane of the projection optical system 3, the photosensors 15 detect a maximum light amount.

The positional relationship between the original 1 and the substrate stage 5 or 6 can be measured by monitoring the outputs from the photosensors 15 disposed under the image-side fiducial marks 43 while driving the substrate stage 5 or 6.

The original stage 2 mounts an object-side fiducial plate 13 including object-side fiducial marks 42. The object-side fiducial marks 42 can be configured by, for example, forming opening portions in a light-shielding film made of, e.g., chromium. The use of the object-side fiducial marks 42 and image-side fiducial marks 43 allows measurement of the positional relationship between the original stage 2 and the substrate stage 5 or 6.

In this embodiment, the exposure apparatus EX is a scanning exposure apparatus which exposes the substrate 7 to slit-shaped exposure light (to be referred to as slit light hereinafter) while scanning the original 1 and substrate 7. Referring to FIGS. 4A and 4B, the Y direction is the scanning direction, and the X direction is both a direction perpendicular to the scanning direction and the longitudinal direction of the slit light. The controller 30 can correct a magnification error in the X direction by correcting the projection magnification of the projection optical system 3. The controller 30 can correct a magnification error in the Y direction by correcting the speed of at least one of the original 1 and the substrate 7 during scanning exposure and/or by correcting the projection magnification of the projection optical system 3.

To measure a magnification error attributed to deformation of the original 1, the original 1 includes a plurality of marks 41 located on it. A complicated distortion shape of the original 1 can be measured by locating four or more marks 41 on the original 1.

During exposure of the substrate 7, the original 1 receives exposure light and therefore thermally deforms. In contrast, even during exposure of the substrate 7, the object-side fiducial plate 13 does not receive exposure light and therefore its shape is stable. A magnification error attributed to the projection optical system 3 can be measured by measuring the positions of the object-side fiducial marks 42 drawn on the object-side fiducial plate 13 using the TTL (Through The Lens) scheme.

The marks 41 can be formed on the original 1 by, e.g., drawing using an electron-beam exposure apparatus. The positions of the marks 41 on the original 1 may naturally include an error of the electron-beam exposure apparatus. The mark drawing error may be, for example, about several nanometers to several tens of nanometers. The mark drawing error turns into a measurement error of deformation of the original 1 if left uncorrected, so it can be eliminated in measuring thermal deformation of the original 1.

FIG. 5 is a flowchart showing the operation of the exposure apparatus EX according to the embodiment of the present invention. This operation is controlled by the controller 30 and includes a process of correcting a magnification error attributed to thermal deformation of the original 1.

In step S501, an original 1 is transported onto the original stage 2 under the control of the controller 30. At this time, one or a plurality of original transport mechanisms (not shown) transport an original 1. In step S502, the controller 30 determines whether the original 1 transported onto the original stage 2 is unused for exposure after being loaded from the outside of the chamber 20 to its inside. If the original 1 transported onto the original stage 2 is unused for exposure after being loaded from the outside of the chamber 20 to its inside, the process advances to step S503; otherwise, the process advances to step S513.

In step S503, the controller 30 determines whether the original 1 transported onto the original stage 2 is the one loaded into the chamber 20 for the first time. This determination can be done based on, for example, the ID (identifier) of the original 1. Since there exists no information concerning drawing errors of the marks 41 on the original 1 loaded into the chamber 20 for the first time, the drawing errors need to be measured. If the original 1 transported onto the original stage 2 is the one loaded into the chamber 20 for the first time, the process advances to step S504; otherwise, the process advances to step S509. If there is no need to take account of any drawing errors, steps S503 to S507 are unnecessary.

In step S504, the controller 30 waits for a waiting time sufficient for the temperature of the original 1 to reach that in the chamber 20 after the original 1 is loaded into the chamber 20. The waiting time can be determined in advance by taking account of, for example, an expected maximum temperature difference between the interior and exterior of the chamber 20. The elapse of the waiting time ensures that the temperature of the original 1 is equal to that in the chamber 20. This amounts to ensuring that the deformation amount of an original attributed to the temperature difference between the interior and exterior of a chamber (the deformation amount of the original with reference to its shape at the temperature in the chamber) is zero. Note that the procedure involved may be changed so that the controller 30 waits for the above-mentioned waiting time on, for example, the original transport route before the original 1 is transported onto the original stage 2.

The exposure apparatus EX can include a temperature control unit 21 for controlling the temperature of the original 1 loaded into the chamber 20 close to the temperature in the chamber 20. The temperature control unit 21 can include a mechanism which, for example, blows a gas such as CDA (Clean Dry Air) whose temperature is adjusted to that in the chamber 20 to the original 1. Alternatively, the temperature control unit 21 can include a mechanism which supplies a temperature adjusting medium (e.g., a coolant oil or a fluid such as cooling water) to a member (e.g., an original chuck set on the original stage 2 in order to hold the original 1) which comes into contact with the original 1. In addition, the temperature control unit 21 preferably includes a sensor (e.g., a noncontact thermometer such as an infrared thermometer) which measures the temperature of the original 1, and may adjust the temperature of a gas such as CDS blown to the original 1 or that of the above-mentioned temperature adjusting medium based on the detection result obtained by the sensor.

In step S505, the measurement unit M performs TTL measurement of offsets between the marks 41 drawn on the original 1 and the image-side fiducial marks 43 under the control of the controller 30.

In step S506, the measurement unit M performs TTL measurement of offsets between the object-side fiducial marks 42 and the image-side fiducial marks 43 under the control of the controller 30. Note that in this embodiment, the temperature of the original 1 is made equal to that in the chamber 20 in step S504. Hence, the measurement values of the marks 41 on the original 1 obtained in step S505 do not include the deformation amount of the original 1 attributed to the temperature difference between the exterior and interior of the chamber 20. The measurement values of the marks 41 on the original 1 obtained in step S505 include drawing errors of the marks 41 on the original 1, and the aberrations of the projection optical system 3.

A magnification error will be considered herein as an example. The original 1 is assumed to include two marks 41 drawn at positions spaced apart from each other by Wr [mm] in the X direction. The marks 41 will be referred to as an original left mark and an original right mark hereinafter. The offset amounts of the original left mark and original right mark obtained by the measurement in step S505 are assumed as OfsL [nm] and OfsR [nm], respectively. The controller 30 can calculate a deformation amount $\beta r$ [ppm] of the original 1 evaluated as a magnification error in accordance with:

$$\beta r = \{OfsR - OfsL\}/Wr \quad (1)$$

In contrast, the measurement values of the object-side fiducial marks 42 on the object-side fiducial plate 13 obtained in step S506 include only a magnification error attributed to the projection optical system 3. To be precise, the magnification error may include drawing errors of the object-side fiducial marks 42 and image-side fiducial marks 43. However, these drawing errors are fixed components and therefore can be calibrated in advance.

The object-side fiducial plate 13 is assumed to include two object-side fiducial marks 42 drawn at positions spaced apart from each other by Ws [mm] in the X direction. The object-side fiducial marks 42 will be referred to as a left fiducial mark and a right fiducial mark hereinafter. The offset amounts of the left fiducial mark and right fiducial mark obtained by the measurement in step S506 are assumed as OfsLs [nm] and OfsRs [nm], respectively. The controller 30 calculates a magnification error $\beta s$ [ppm] in accordance with:

$$\beta s = \{OfsRs - OfsLs\}/Ws \quad (2)$$

In step S507, the controller 30 calculates a drawing error $\beta f$ [ppm] on the original 1 in accordance with:

$$\beta f = \beta r - \beta s \quad (3)$$

and stores the drawing error $\beta f$.

A deformation amount (to be referred to as the deformation amount before exposure hereinafter) $\beta 0$ of an original 1 which is loaded into the chamber 20 and unused for exposure is zero because the temperature of the original 1 is equal to that in the chamber 20. The controller 30 stores "0" as the value of $\beta 0$.

If it is determined in step S503 that the original 1 has already been used for exposure, a drawing error on the original 1 has already been determined and stored. For this reason, processes (S509 and S510) for determining the deformation amount of the original 1 before exposure are performed without waiting for a waiting time to ensure that the temperature of the original 1 is equal to that in the chamber 20.

More specifically, in step S509, the measurement unit M performs TTL measurement of offsets between the marks 41 drawn on the original 1 and the image-side fiducial marks 43 under the control of the controller 30.

In step S510, the measurement unit M performs TTL measurement of offsets between the object-side fiducial marks 42 and the image-side fiducial marks 43 under the control of the controller 30.

In step S511, the controller 30 calculates a deformation amount $\beta 0$ [ppm] of the original 1 before exposure in accordance with the following method.

The offset amounts of the original left mark and original right mark obtained by the measurement in step S509 are assumed herein as OfsL' [nm] and OfsR' [nm], respectively. The controller 30 calculates a deformation amount $\beta r'$ [ppm] of the original 1 evaluated as a magnification error in accordance with:

$$\beta r' = \{OfsR' - OfsL'\}/Wr \quad (4)$$

The offset amounts of the left fiducial mark and right fiducial mark obtained by the measurement in step S510 are assumed as OfsLs' [nm] and OfsRs' [nm], respectively. The controller 30 calculate a magnification error $\beta s'$ [ppm] in accordance with:

$$\beta s' = \{OfsRs' - OfsLs'\}/Ws \quad (5)$$

Furthermore, the controller 30 calculates a deformation amount $\beta 0$ [ppm] of the original 1 before exposure in accordance with:

$$\beta 0 = \beta r' - \beta s' - \beta f \quad (6)$$

When the drawing error $\beta f$ is negligible, equation (6) can be written as:

$$\beta 0 = \beta r' - \beta s' \quad (7)$$

In this case, the controller 30 calculates a deformation amount $\beta 0$ [ppm] of the original 1 before exposure in accordance with equation (7).

Also, when the magnification errors $\beta s$ and $\beta s'$ attributed to the projection optical system 3 are negligible, equation (6) can be written as:

$$\beta 0 = \beta r' - \beta r \quad (8)$$

In this case, the controller 30 can calculate a deformation amount $\beta 0$ [ppm] of the original 1 before exposure in accordance with equation (8).

Figure 1:
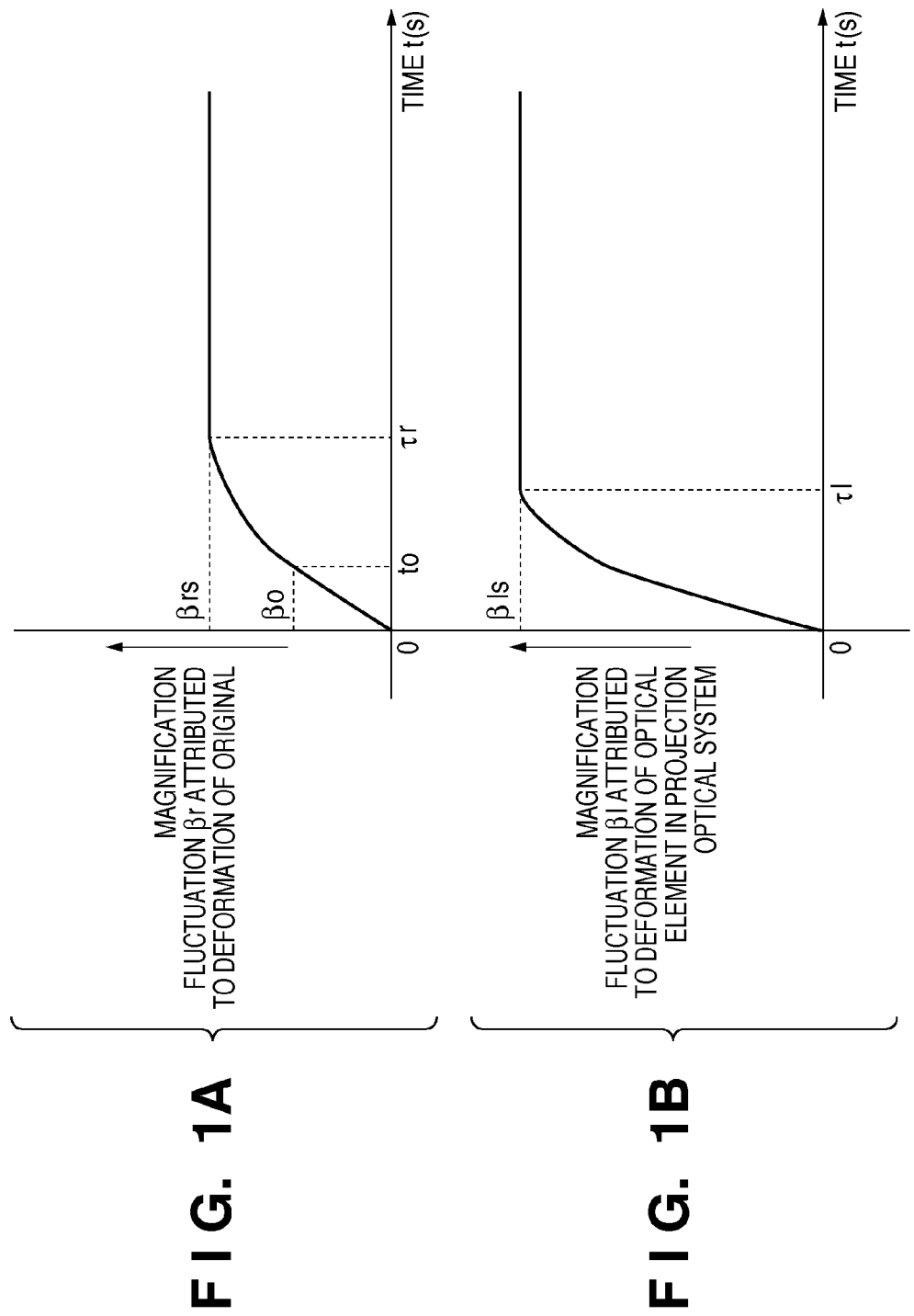
FIGS. 1A and 1B are graphs illustrating magnification fluctuations.
Figure 2:
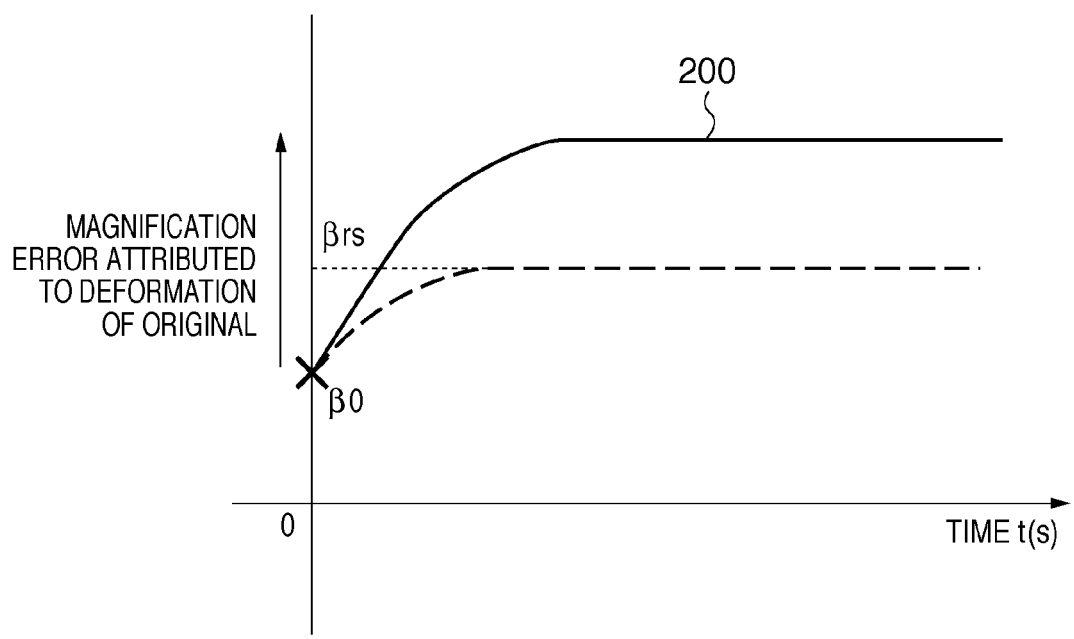
FIG. 2 is a graph for explaining a problem when there is a temperature difference between the interior and exterior of a chamber in an exposure apparatus.

In step S508, the controller 30 calculates the predicted deformation amount of the original 1 based on the curves illustrated in FIGS. 1A and 1B, the deformation amount of the original 1 before exposure calculated in step S507 or S511, and the time for which the original 1 receives exposure light. Note that the curves illustrated in FIGS. 1A and 1B can be included in information representing the relationship between the deformation amount of the original 1 with reference to its shape at the temperature in the chamber 20 and the time for which the original 1 receives exposure light.

Let t be the time for which the original 1 receives exposure light, and $\beta r$ be the deformation amount of the original 1 with reference to its shape at the temperature in the chamber 20. Then, the deformation amount $\beta r$ illustrated in FIG. 1A can be expressed as a function of the time t, i.e., a function $\beta r(t)$. Also, let $\beta r0$ be the deformation amount of the original 1 before exposure, t0 be the time until the value of the function $\beta r(t)$ reaches the deformation amount $\beta r0$ before exposure, and $\beta re$ be the predicted deformation amount of the original 1. Then, the controller 30 can calculate a predicted deformation amount $\beta re$ of the original 1 in accordance with:

$$\beta re = \beta r(t+t0) \quad (9)$$

Figure 6:
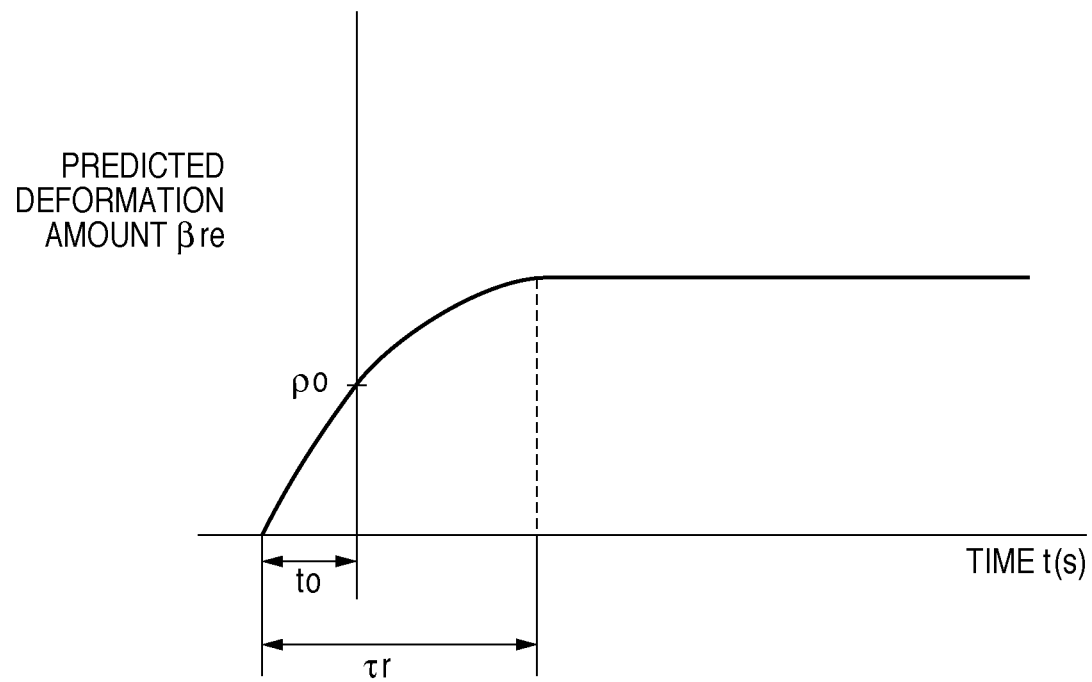
FIG. 6 is a graph illustrating the predicted deformation amount of the original.

FIG. 6 is a graph illustrating the predicted deformation amount $\beta re$ of the original.

Note that the shape of the original 1 at the temperature in the chamber 20 is used as a criterion for indicating the deformation amount of the original. However, the shape of the original 1 at another arbitrary temperature condition (e.g., 23.0° C.) may be used as a criterion. When, for example, the temperature in the chamber 20 fluctuates locally or temporally, the use of the temperature condition as a constant can facilitate a computation process and a temperature control process.

In step S512, an exposure process is performed for the substrate 7 using the original 1 under the control of the controller 30. At this time, the controller 30 corrects the projection magnification of the projection optical system 3 so as to correct the predicted deformation amount of the original 1. When the exposure apparatus EX is a scanning exposure apparatus, the controller 30 may control the scanning speed of at least one of the original 1 and the substrate 7 so as to correct the predicted deformation amount of the original 1 in the scanning direction. Note that the exposure process includes measurement performed in advance in the measurement area 10 in preparation for substrate exposure in the exposure area 11.

In step S514, the controller 30 determines whether to continue the exposure process and whether original replacement is necessary. If the exposure process is to be continued without original replacement, the process returns to step S508. If the exposure process is to be continued after original replacement, the process returns to step S501. In other cases, the exposure process is ended.

When an original 1 is transported from a position inside the chamber 20 (this position is supposed to be, e.g., an original cabinet in the chamber 20) onto the original stage 2 in step S501, the temperature of the original 1 is equal to that in the chamber 20. Hence, the deformation amount $\beta 0$ before exposure may be set to zero and step S511 may be performed immediately. However, as shown in FIG. 5, when an original 1 is transported from a position inside the chamber 20 onto the original stage 2, in step S513 the measurement unit M may perform TTL measurement of offsets between the marks 41 drawn on the original 1 and the image-side fiducial marks 43. With this operation, if, for example, the original 1 deforms in excess of a tolerance for some reason, this deformation can be detected.

In the example shown in FIG. 5, in step S504 the controller 30 waits for a waiting time set in advance to ensure that the temperature of the original 1 is equal to that in the chamber 20. However, the waiting time can be omitted or shortened by taking an original for use in an exposure job into the chamber 20 before the start of the exposure job. For example, if the controller 30 confirms that the time elapsed after the original 1 is loaded into the chamber 20 exceeds a predetermined waiting time in step S504, it need only advance the process to step S505. Also, if the elapsed time is less than the predetermined waiting time, the controller 30 need only wait for the remaining time and advance the process to step S505. This makes it possible to shorten the nonproductive time in the exposure apparatus.

Instead of measuring drawing errors on the original in steps S504 to S507, a receiving unit 31 (see FIG. 3) may receive the information of these errors from an external apparatus.

For example, assume that an exposure apparatus A uses a certain original for the first time. In this case, as long as another exposure apparatus B has already measured drawing errors on the certain original, the drawing errors measured by the exposure apparatus B can be transferred to the exposure apparatus A. Data communication between exposure apparatuses can be done via, for example, a host computer connected to a plurality of exposure apparatuses online. Also, an apparatus other than an exposure apparatus may measure drawing errors on an original and transmit the drawing errors to the exposure apparatus. As long as drawing errors can be transmitted to the controller 30 of the exposure apparatus in advance, steps S504 to S507 can be omitted even for an original used for the first time, and the processes in steps S508 and S509 can be performed through steps S509 to S511 immediately after loading the original. In this case, the controller 30 need only determine in step S503 whether the exposure apparatus (controller 30) has already acquired drawing errors of an original to be used.

Although magnification error correction has been explained as an example herein, the present invention is also applicable to other error components which can be calculated based on the measurement values of the offset amounts of the marks 41 formed on the original 1. For example, assume that n (n>3) or more marks are arranged in the X direction. In this case, a correction amount corresponding to three-dimensional distortion can be calculated as long as a cubic equation:

$$\delta x = a \cdot X^3 + b \cdot X^2 + c \cdot X + d$$

is determined, where the coefficients a to d can be calculated by least squares approximation.

The cubic equation expresses an offset amount δx at an arbitrary design coordinate X can be determined using design coordinates X1 to Xn of respective marks and data on offset amounts δx1 to δxn of respective marks.

It is also possible to measure the offset amounts of a plurality of marks spaced apart from each other in the Y direction, and calculate the magnification of an original in the Y direction using the measurement results. Moreover, it is possible to calculate the flexure shape of an original as long as the offset amounts in the Z direction are measured at a large number of points on the original. The basic concept of the present invention, in which the deformation amount of an original before exposure is calculated and then prediction and correction are performed by a thermal change curve, is applicable to all correction amounts.

Also, the original used may be transmissive or reflective. A reflective original used in an EUV exposure apparatus has a pattern formed on it by forming a low-reflectance portion in a predetermined shape on a multilayer film which reflects EUV light. Japanese Patent Laid-Open No. 2003-142363 discloses details of alignment of a reflective original. Based on the measurement values of the offset amounts of marks, deformation of a reflective original before exposure can be calculated as well.

Further, information corresponding to drawing errors on an original and the deformation amount of the original before exposure may also be acquired by a method different from a mark measurement method. For example, a sensor (e.g., a noncontact infrared thermography) which measures the temperature of an original may be built in an exposure apparatus and measure the temperature of an original loaded from the outside of the exposure apparatus to its inside. This makes it possible to predict, information corresponding to drawing errors of an original and the deformation amount of the original before exposure, based on the temperature of the original.

Although the predicted deformation amount of an original is calculated in step S508 by using the time t for which the original receives exposure light, the predicted deformation amount can be calculated by using a parameter other than the time t. For example, a parameter having a correlation with the total amount of exposure energy accumulated in the original can be used. That is, the controller 30 can calculate the predicted deformation amount based on:

(a) information representing a relationship between a deformation amount of the original with reference to a shape of the original at a certain temperature and a parameter having a correlation with the total amount of exposure energy accumulated in the original,
(b) a deformation amount of the original before exposure determined based on a measurement value obtained by measuring, by the measurement unit, a deformation amount of the original which is loaded into the chamber and unused for exposure, and
(c) the parameter.

The exposure energy accumulated in the original is deference between the total amount of energy provided to the original and the total amount of exposure energy emitted from the original. Such a parameter can be a parameter which is countable by the controller 30, for example, the number of processed substrates, the number of exposed shot regions, or the number of pulses of exposure light irradiating the original.

Alternatively, if it is possible to predict the energy accumulated in the original by measuring temperature of the original or a vicinity of it using a temperature sensor, the measured temperature can be used as the parameter.

A device manufacturing method according to an embodiment of the present invention can be used to manufacture devices such as a semiconductor device and a liquid crystal device. The method can include the steps of exposing a substrate coated with a photosensitive agent using the above-mentioned exposure apparatus, and developing the exposed substrate. The device manufacturing method can also include the known subsequent steps (e.g., oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-312490, filed Dec. 8, 2008, and No. 2009-259793, filed Nov. 13, 2009, which are hereby incorporated by reference herein in their entirety.

What is claimed is:

1. An exposure apparatus which projects a pattern of an original onto a substrate by a projection optical system within a chamber to expose the substrate, comprising:
   a measurement unit configured to perform measurement to calculate a deformation amount of the original; and
   a controller configured to calculate a predicted deformation amount βre of the original and to correct a projection magnification of the projection optical system so as to correct the predicted deformation amount, based on (a) a function $\beta r(t)$ which indicates the deformation amount of the original with reference to a shape of the original at a certain temperature, the function $\beta r(t)$ being a function of a time t during which the original receives exposure light, (b) a deformation amount $\beta r0$ of the original before exposure, at a temperature which is not the certain temperature, the deformation amount $\beta r0$ being determined based on a measurement value obtained by measuring, by the measurement unit, the original which is loaded into the chamber and unused for exposure, and (c) the time t, wherein the controller calculates the predicted deformation amount $\beta re$ of the original in accordance with the equation $\beta re = \beta r(t+t0)$, and wherein t0 is a time until the value of the function $\beta r(t)$ reaches the deformation amount $\beta r0$.

2. The exposure apparatus according to claim 1, wherein the certain temperature is a temperature in the chamber.

3. The exposure apparatus according to claim 1, wherein the measurement unit measures a position of a mark drawn on the original, and wherein the controller determines the deformation amount of the original before exposure by correcting a drawing error of the mark included in the measurement value obtained by the measurement unit.

4. The exposure apparatus according to claim 3, wherein the drawing error is determined by measurement thereof by the measurement unit after a time has elapsed sufficient for a temperature of the original to reach the temperature in the chamber.

5. The exposure apparatus according to claim 4, further comprising a temperature control unit configured to control the temperature of the original loaded into the chamber close to the temperature in the chamber.

6. The exposure apparatus according to claim 3, further comprising a receiving unit configured to receive information representing the drawing error from an external apparatus.

7. The exposure apparatus according to claim 1, wherein the controller causes the measurement unit to measure a position of a mark drawn on the original and a position of a mark located on an original stage which holds the original, and calculates the predicted deformation amount based on the measurement values obtained by the measurement unit.

8. The exposure apparatus according to claim 1, wherein the measurement unit includes a sensor configured to measure a temperature of the original.

9. The exposure apparatus according to claim 1, wherein the controller corrects not only the projection magnification of the projection optical system but also a scanning speed of at least one of the original and the substrate so as to correct the predicted deformation amount.

10. A device manufacturing method comprising the steps of:

exposing a substrate using an exposure apparatus; and developing the substrate, wherein the exposure apparatus projects a pattern of an original onto a substrate by a projection optical system within a chamber to expose the substrate and comprises:

a measurement unit configured to perform measurement to calculate a deformation amount of the original, a controller configured to calculate a predicted deformation amount $\beta re$ of the original and correct a projection magnification of the projection optical system so as to correct the predicted deformation amount, based on (a) a function $\beta r(t)$ which indicates a deformation amount of the original with reference to a shape of the original at a certain temperature, the function $\beta r(t)$ being a function of a time t during which the original receives exposure light, (b) a deformation amount $\beta r0$ of the original before exposure, at a temperature which is not the certain temperature, the deformation amount $\beta r0$ being determined based on a measurement value obtained by measuring, by the measurement unit, the original which is loaded into the chamber and unused for exposure, and (c) the time t, wherein the controller calculates the predicted deformation amount $\beta re$ of the original in accordance with the equation $\beta re = \beta r(t+t0)$, and wherein t0 is a time until the value of the function $\beta r(t)$ reaches the deformation amount $\beta r0$.

* * * * *